US008848944B1

(12) United States Patent
Civiletti

(10) Patent No.: US 8,848,944 B1
(45) Date of Patent: Sep. 30, 2014

(54) LOW POWERED GUITAR AMPLIFER WITH OR WITHOUT ATTENUATOR

(76) Inventor: Michael Steven Civiletti, Brooklyn, NY (US)

( * ) Notice: Subject to any disclaimer, the term of this patent is extended or adjusted under 35 U.S.C. 154(b) by 224 days.

(21) Appl. No.: 12/313,066

(22) Filed: Nov. 17, 2008

Related U.S. Application Data

(60) Provisional application No. 60/989,088, filed on Nov. 19, 2007.

(51) Int. Cl.
*G10H 1/00* (2006.01)
*H03F 99/00* (2009.01)

(52) U.S. Cl.
USPC .......... 381/118; 381/120

(58) Field of Classification Search
USPC .......... 381/118
See application file for complete search history.

(56) References Cited

U.S. PATENT DOCUMENTS 5,197,102 A * 3/1993 Sondermeyer .......... 381/96
5,734,725 A * 3/1998 Pritchard .......... 381/61
5,859,565 A * 1/1999 Reiffin .......... 330/71
6,111,961 A * 8/2000 Hedrick et al. .......... 381/61
6,265,938 B1 * 7/2001 Reiffin .......... 330/71
6,522,752 B1 * 2/2003 Smith .......... 381/61
6,759,901 B2 * 7/2004 Fryette .......... 330/127
6,792,120 B1 * 9/2004 Szenics .......... 381/120
2002/0048379 A1 * 4/2002 Flentje .......... 381/104
2003/0169106 A1 * 9/2003 Smith .......... 330/118
2003/0179893 A1 * 9/2003 Smith .......... 381/120
2006/0012423 A1 * 1/2006 Smith .......... 330/118
2006/0050900 A1 * 3/2006 Smith .......... 381/118
2006/0176046 A1 * 8/2006 Walker .......... 324/142
2006/0251275 A1 * 11/2006 Ackley .......... 381/118
2008/0204131 A1 * 8/2008 Roberts .......... 330/3
2009/0074205 A1 * 3/2009 Shannon .......... 381/102

* cited by examiner

*Primary Examiner* — Matthew Landau
*Assistant Examiner* — Igwe U Anya

(57) ABSTRACT

A low powered guitar amplifier is disclosed that can generate the overdriven tones of much larger class ab push-pull amplifiers and attenuate them further with an attenuator that leaves the tone and feel intact. This amplifier uses a cathode follower output stage FIG. 1. 12 to generate these powerful tones and a non intrusive attenuation circuit FIG. 2. 46 that benefits from the unique properties of the cathode follower output stage regardless of configuration or topology. These benefits are the ability to drive any impedance above the selected output impedance and no need to maintain a constant impedance therefore utilizing a simple series attenuation circuit whereby substantially all the current is seen in the speaker load and therefore the output stage interaction between the amp and musician is left intact.

17 Claims, 5 Drawing Sheets

LOW POWERED GUITAR AMPLIFER WITH OR WITHOUT ATTENUATOR

CROSS REFERENCE TO RELATED APPLICATIONS

This application claims the benefit of provisional patent application Ser. No. 60/989,088, filed 2007 Nov. 19 by the present inventor.

FEDERALLY SPONSORED RESEARCH

Not Applicable

SEQUENCE LISTING OR PROGRAM

Not Applicable

BACKGROUND

1. Field

This application relates to guitar amplifiers and a means to attenuate them.

2. Prior Art

Musicians' amplifiers, and more specifically, guitar amplifiers, have been used for over 50 years to amplify the sound of instruments. In the case of guitar amplifiers, the function of the amplifier has gone far beyond its original purpose of increasing the volume of a basically acoustic instrument and become an integral part of the sound of the electric guitar. Specifically, the loud, distorted sound typified by the large Marshall and Fender tube amplifier stacks that when intentionally overdriven well beyond the tubes original purpose has become synonymous with the sound of rock and roll guitar. However, for purposes of duplicating these sounds at low volumes for use in small venues or for practice, these large amplifiers are wholly impractical. Indeed, for most uses, the large tube amplifiers have been replaced by smaller, lighter tube amplifiers but paying a drastic penalty in sound quality for rock and roll.

Large amplifiers typically use a highly efficient class ab output topology with at least two tubes conducting much less than 360 degrees but more than 180 degrees in a push-pull configuration with feedback. A two-tube amplifier will typically give you 50 watts output power. This type of output stage when driven hard will distort in a fashion characterized by square waves and a sound that is unique to this type of output stage. One remedy is to use lower power output tubes connected in the same configuration but these tubes sound different than the higher power variants and although the power is lower it is still way too loud for most applications. Another remedy is to use a single ended grounded cathode output stage biased class A or close to it. This configuration has a much lower efficiency therefore less power but the sound is nothing like the musical speaker thrashing square waves of the push pull configuration due to its high output impedance and rounded and flabby distortion characteristics.

Another remedy is to use an attenuator between the output stage and the speaker load of a tube output stage. Sholz U.S. Pat. Nos. 4,363,934 and 4,143,245. Due to the limitation of having to maintain a constant impedance across the load or else imminent tube destruction will occur it necessitates using series and shunting voltage dividers. The end result is the speaker being robbed of tone and the musician complaining that the feel of the overdriven output stage is gone. This flattening out of the tone occurs because the current is being shunted from the speaker and the vital output-stage speaker interaction is gone. This interaction can be felt as a fatness or a resistance while playing that is unmistakable to an experienced musician, and it is one of the most important considerations to the inspiration of the musician and the tone that is achieved.

Yet still another option is to introduce the distortion in the stages prior to the output stage using either vacuum tubes or solid state devices. This leaves much to be desired.

None of these techniques, however, address the critical parameters for emulating loud, distorted classic sound in a small tube guitar amplifier with or without an attenuator therefore, it is the object of the presently preferred embodiment to remedy the foregoing and other deficiencies inherent in the prior art.

Accordingly, it is an object of the presently preferred embodiment to provide a new and improved output stage for a low powered guitar amplifier that remedies the inherent problems of the single ended grounded cathode amplifier while maintaining the attributes of the high powered push-pull amplifiers.

Another objective is to provide a new and improved attenuator circuit for a musical instrument amplifier that when used in conjunction with a cathode follower final output power stage remedies all of the deficiencies of the prior art regardless of configuration or topology.

SUMMARY

In accordance with one embodiment a low powered guitar amplifier comprising a single ended cathode follower output stage and a variable resistor of appropriate power dissipation in series with the speaker load.

DRAWINGS

Figures

Figure 3:
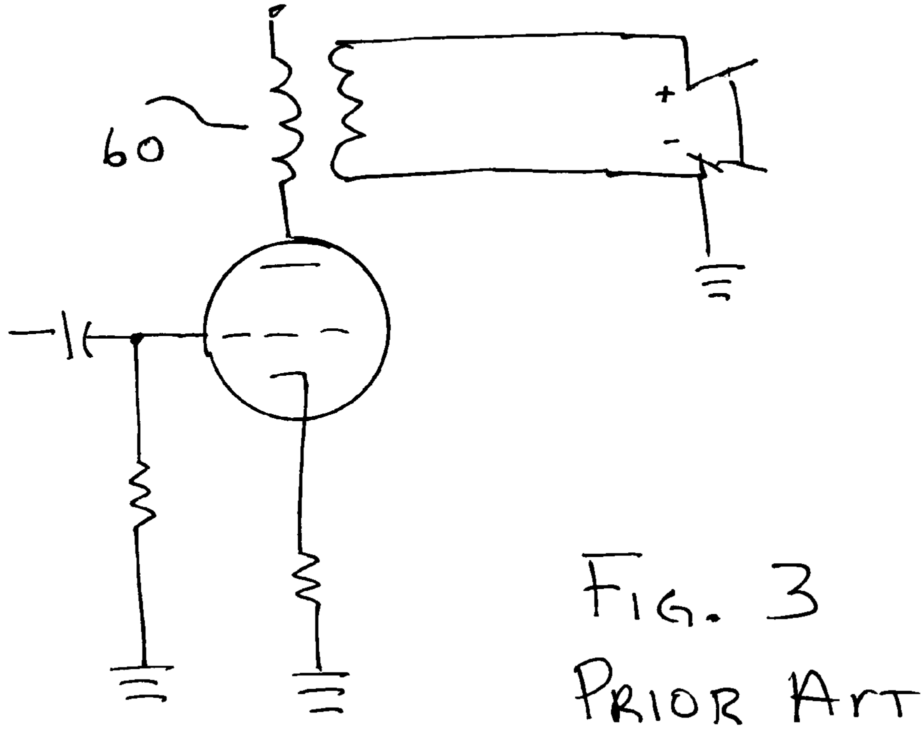
Fig. 3 Prior Art

FIG. 3 conventional grounded Cathode output stage whose output is plate derived.

Figure 4:
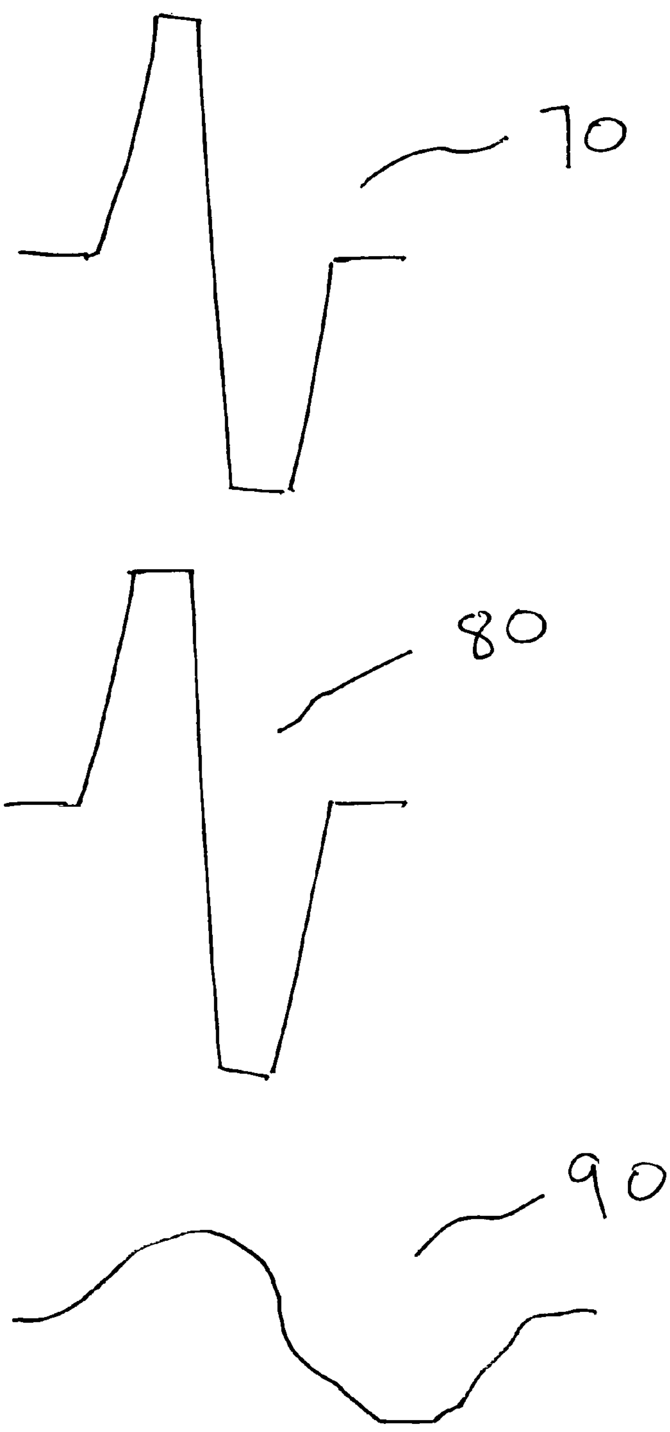

FIG. 4 is a waveform diagram illustrating the output waveform performance as compared to a high power push-pull amplifier and a single ended grounded cathode amplifier.

Figure 5:
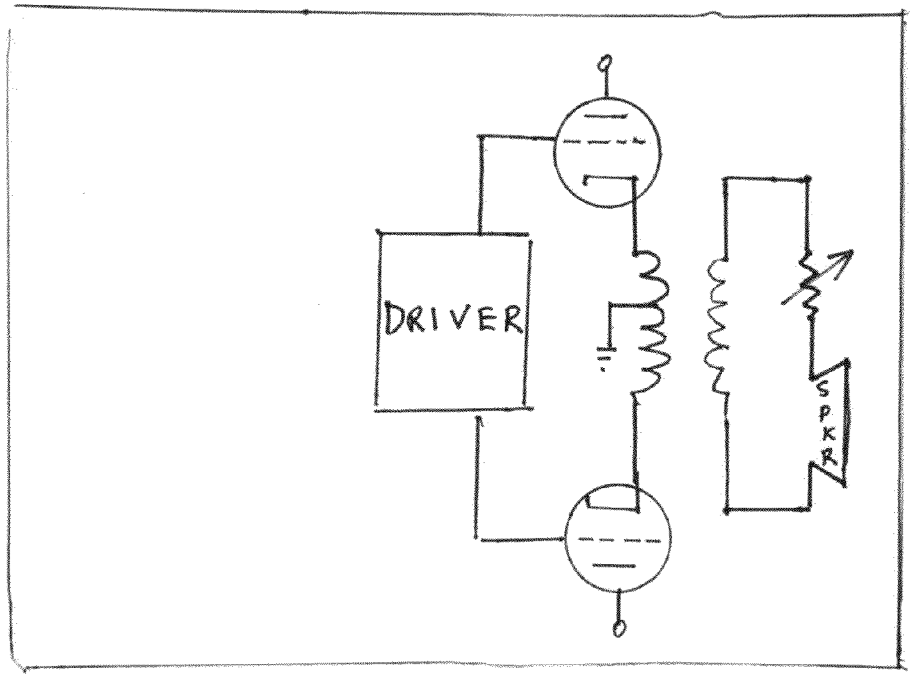

FIG. 5 shows a push-pull cathode follower final output stage.

DETAILED DESCRIPTION

First Embodiment

Figure 1:
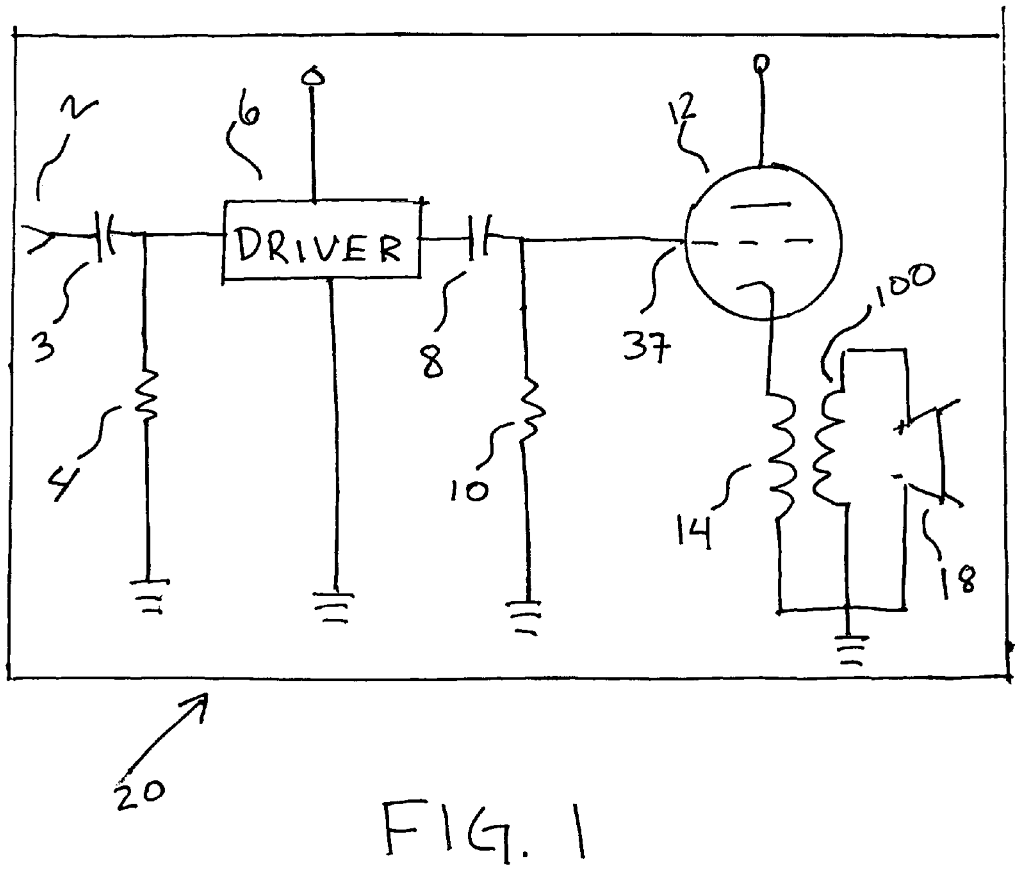
FIG. 1 is a block diagram showing the principals of the presently preferred embodiment.

With reference now to the drawings, and more particularly FIG. 1, there is shown a block diagram of the cathode follower output stage 20. Input 2 receives its signal from the prior stages of the guitar amplifier such as the low level inputs which are instrument level and provide sufficient gain to intentionally overdrive the amplifier to the desired level required for the type of music the amplifier is designed for, tone shaping circuits and pre driver. Grid leak resistor 4 in conjunction with input capacitor 3 set the low frequency slope and the gain in conjunction with the previous stage to a level sufficient to drive the driver stage 6. The afore mentioned driver stage must be capable of taking normal signal levels that reside in a typical guitar amplifier and transforming them into extremely high voltages on the order of many hundreds of volts to drive the cathode follower output stage anywhere from clean to hard clipping. This high voltage signal is then applied to input capacitor 8 in conjunction with grid leak resistor 10 to the grid 37 of cathode follower output tube 12. Since the cathode follower has no gain and there is actually a loss associated with this circuit because of high internal negative feedback, most of this high voltage signal is seen on the output transformer primary 14, which through transformer action is stepped down on the secondary 100 and drives the speaker 18. This circuit is called a cathode follower because the output is cathode derived. The cathode follows the grid with a gain of less than unity. This circuit has the important attribute of low output impedance, Zo=rp/(mu+1) as compared to the grounded cathode amplifier Zo=rp. The low output impedance in conjunction high internal negative feedback creates sharp well defined square waves like the high power push-pull output stages when driving a speaker and the distortion products are highly musical.

DETAILED DESCRIPTION

Presently Preferred Embodiment

Figure 2:
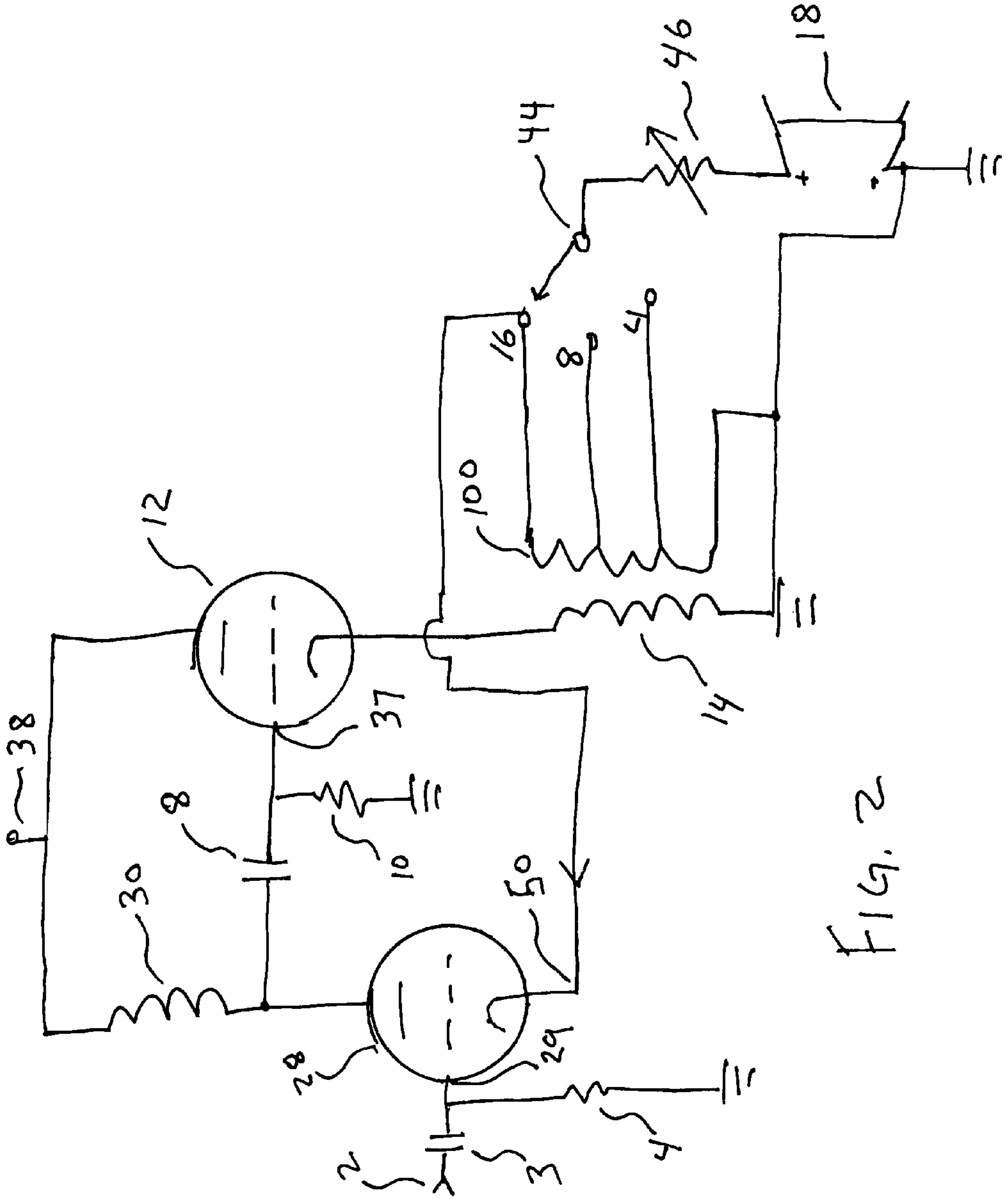
FIG. 2 is the presently preferred embodiment.

Referring now to FIG. 2 the amplifying circuit of the presently preferred embodiment is illustrated utilizing a 6sn7 vacuum tube with a plate choke 30 for the driver stage 28. In its broader aspects, the invention can be implemented using other types of electronic amplification devices in other configurations such as a push-pull cathode follower output stage which shares the same unique characteristics FIG. 5. Accordingly, the invention is not to be limited to only the preferred embodiment described, or to being housed in a single chassis. Input 2 receives its signal from the predriver stage; capacitor 3 and grid leak resistor 4 set the gain and low frequency slope in accordance with the predriver output impedance. This signal is applied to the grid 29 of the driver stage 28 thus causing a large swing in the plate choke 30 well above the positive voltage rail and well below ground. In this embodiment the choke is a Magnaquest ex001. Any equivalent choke with approximately 900 ohms direct current resistance will suffice. This creates the necessary voltage swing to drive the cathode follower output to full clipping when the positive voltage rail 38 is 296 volts and applied to both plates 38. This signal is applied to the grid 37 of the cathode follower output stage 12 via the network of capacitor 8 and resistor 10, which in this embodiment is an e134. A One Electron UBT-3 which has a 3 k ohm primary is the output transformer being utilized in this embodiment and its primary 14 is excited by the large voltage applied to the grid 37 thereby through transformer action exciting its secondary 100. It must be noted that the heater to cathode breakdown voltage will be exceeded with such a large voltage across the primary winding 14 therefore the heater cannot be referenced to ground and must be kept floating with no direct current path to ground. The cathode 50 of driver stage 28 is connected to the 16 ohm tap of the output transformer secondary 100 which provides a ground path and negative feedback simultaneously, thus decreasing overall gain and providing stabilization while when driving this output stage to extremes. Output impedance selector switch 44 selects the appropriate tap for the speaker cabinet being used. Since a cathode follower has no gain and its voltage is derived by the voltage applied to its grid it is possible to run this circuit with no load applied which is forbidden in other output stage topologies. Accordingly it is also possible to vary the load upward to any impedance facilitating a simple attenuator of a variable resistor 46 in series with the speaker 18 creating a voltage divider between it and the speaker and thus preserving output stage speaker interaction because all the current is going through the speaker and not being shunted elsewhere.

FIG. 3 is a guitar amplifier output stage output stage utilizing a grounded cathode configuration where the output transformer primary 60 is plate driven.

Turning now to FIG. 4 is an illustration of all output stages under consideration being overdriven. 70 is a class ab push-pull stage being overdriven. 80 is the cathode follower and 90 is the grounded cathode.

Thus, it can be seen that the disclosed output stage circuits in accordance with the presently preferred embodiment provides a new and improved means for generating the powerful tones of the larger amplifier output stages and a simplified attenuation circuit owing to the fact that a cathode follower output stage can drive any output impedance above the rated secondary tap impedance. All that is needed is a resistive device in series creating a voltage divider with the speaker taking full advantage of the unique characteristics of the cathode follower output stage.

And in addition because the actual output power is being reduced instead of dissipated as heat, and then further divided between the resistor and the speaker load, the attenuation resistor need not be able to dissipate the full un-attenuated power of the output stage. There are many factors to the dissipation requirements which peak when the voltage division between speaker and the resistor are close, such as speaker impedance and attenuation levels, but the class of operation, number of tubes, type of tubes, single ended, push pull, will not affect the dissipation requirements because a cathode follower output stage regardless of configuration or topology all share the same unique characteristics and benefits. A variable resistor such as a rheostat of 300 ohms capable of dissipating one half of the total output power in series with the speaker load is a good place to start, and that includes a generous safety margin and significant attenuation.

Further since substantially all the current is going through the speaker and not being shunted away from the speaker to maintain a constant direct current impedance the feel of the amp and the tone remain constant at all attenuation levels. The fact that the output impedance is so low coupled with the inherent internal negative feedback of the output stage, when driven hard the waveforms are substantially the same as the larger push-pull output stages. More power can be obtained by adding additional output tubes in parallel which will give approximately 10 watts per tube.

Various changes and modifications to the embodiments herein chosen for purposes of illustration will readily occur to those skilled in the art. To the extent that such modifications and variations do not depart from the spirit of the invention, they are intended to be included within the scope thereof which is accessed only by a fair interpretation of the following claims.

The invention claimed is:

1. An amplifier for use with a musical instrument comprising:

At least one low level input gain-staged to receive an instrument-level signal, said low level input being characterized as having sufficient overall gain to intentionally overdrive one or more subsequent gain stages so as to enhance said signal by the addition of non-linear distortion products, tone shaping circuitry to purposefully alter the frequency response of said amplifier from flat, and a final output power stage to generate power stage distortion products when intentionally overdriven during normal operation, said final output power stage comprising at least one vacuum tube configured as a cathode follower with its cathode electrically coupled to a primary winding of an output transformer so as to provide a drive current in said primary winding of said output transformer.

2. The amplifier of claim 1, wherein said primary winding of said output transformer is inductively coupled to a secondary winding.

3. The amplifier of claim 2, wherein said secondary winding being operable to drive a speaker load by electrically coupling to said speaker load.

4. The amplifier of claim 3, further comprising an output power attenuator to dissipate power delivered to said speaker load by said secondary winding.

5. The amplifier of claim 4, wherein said output power attenuator comprises a resistor, said resistor being coupled electrically in series, with said secondary winding and said speaker load irrespective of a total load impedance above a rated output impedance of said final output power stage, thereby substantially reducing branch currents.

6. The amplifier of claim 5, wherein said resistor is variable.

7. The amplifier of claim 6, wherein said resistor is a rheostat.

8. The amplifier of claim 7, further comprising a final output power stage driver configured to receive a negative feedback signal from said secondary winding so as to provide gain stabilization and overall stability when overdriving said at least one vacuum tube to extreme levels of distortion.

9. The amplifier of claim 8, wherein said driver comprises a plate choke to provide a high drive voltage required to drive said at least one vacuum tube configured as a cathode follower.

10. A final output power stage for a musical instrument amplifier comprising:

a) one or more vacuum tubes configured as a cathode follower to generate power stage distortion products when intentionally overdriven during normal operation;

b) an output transformer with a primary winding inductively coupled to a secondary winding; the one or more vacuum tubes having its cathode electrically coupled to said primary winding of said output transformer so as to provide a drive current in said primary winding, said secondary winding being operable to drive a speaker load by electrically coupling to said speaker load, said final output power stage further comprising an output power attenuator, said output power attenuator comprising a resistor coupled electrically in series with said secondary winding and said speaker load irrespective of a total load impedance above the rated output impedance of said final output power stage, thereby substantially reducing branch currents.

11. The final output power stage of claim 10, wherein said resistor is variable.

12. The final output power stage of claim 11, wherein said resistor is a rheostat.

13. The final output power stage of claim 12, further comprising a driver configured to receive a negative feedback signal from said secondary winding so as to provide gain stabilization and overall stability when overdriving said one or more vacuum tubes to extreme levels of distortion.

14. The final output power stage of claim 13, wherein said driver comprises a plate choke to provide a high drive voltage required to drive said one or more vacuum tubes configured as a cathode follower.

15. A method of attenuating a vacuum tube final output power stage for a musical instrument amplifier that is characterized by the fact that when attenuated, it delivers power to a speaker load with substantially reduced branch currents comprising:

a) providing one or more vacuum tubes configured as a cathode follower with its grid configured to receive an input signal;

b) providing an output transformer with a primary winding inductively coupled to a secondary winding, said secondary winding being capable of driving a speaker load;

c) forming an inductively coupled signal path to deliver power to a load by way of said secondary winding, said inductively coupled signal path being formed by electrically coupling said one or more vacuum tubes cathode to said primary winding so as to provide a drive current signal path in said primary winding;

d) providing a resistor operably configured to couple electrically in series with said secondary winding and a speaker load irrespective of a total load impedance above a rated output impedance of said final output power stage, thereby substantially reducing branch currents.

16. The method of claim 15, wherein said resistor is variable.

17. The method of claim 16, wherein said resistor is a rheostat.

* * * * *